(12) United States Patent
Matsui et al.

(10) Patent No.: US 10,971,369 B2
(45) Date of Patent: Apr. 6, 2021

(54) PLASMA PROCESSING METHOD AND PLASMA PROCESSING APPARATUS

(71) Applicant: HITACHI HIGH-TECH CORPORATION, Tokyo (JP)

(72) Inventors: Miyako Matsui, Tokyo (JP); Tatehito Usui, Tokyo (JP); Masaru Izawa, Tokyo (JP); Kenichi Kuwahara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/328,228

(22) PCT Filed: Jan. 31, 2018

(86) PCT No.: PCT/JP2018/003165
§ 371 (c)(1),
(2) Date: Feb. 25, 2019

(87) PCT Pub. No.: WO2019/003483
PCT Pub. Date: Jan. 3, 2019

(65) Prior Publication Data
US 2019/0237337 A1 Aug. 1, 2019

(51) Int. Cl.
*H01L 21/3065* (2006.01)
*H01L 21/66* (2006.01)
(Continued)

(52) U.S. Cl.
CPC ...... *H01L 21/30655* (2013.01); *G01B 11/065* (2013.01); *G01B 11/0625* (2013.01);
(Continued)

(58) Field of Classification Search
CPC ............... G01B 11/0625; G01B 11/065; H01J 2237/24578; H01J 2237/332;
(Continued)

(56) References Cited

U.S. PATENT DOCUMENTS 6,390,019 B1    5/2002 Grimbergen et al.
6,831,742 B1 *  12/2004 Sui ..................... G01N 21/21
                                                356/369
(Continued)

FOREIGN PATENT DOCUMENTS

JP    2001332534 A    11/2001
JP    2004526293 A     8/2004
(Continued)

OTHER PUBLICATIONS

Dominik Metzler et al.; Fluorocarbon Assisted Atomic Layer Etching of SiO2 Using Cyclic Ar/C4F8 Plasma; Journal of Vacuum Science & Technology; vol. 32; No. 2; Mar./Apr. 2014; pp. 020603-1-020603-4.
(Continued)

*Primary Examiner* — Lan Vinh
(74) *Attorney, Agent, or Firm* — Miles & Stockbridge, P.C.

(57) ABSTRACT

In cycle etching in which a depo process and an etching process are repeated, a depo film thickness over a pattern is controlled precisely, and etching is executed to have a desired shape stably for a long time. There are included the depo process (S1) of introducing a reactive gas having a deposit property to a processing chamber and forming a deposit layer over the surface of a pattern to be etched of a substrate to be etched, the etching process (S2) of removing a reaction product of the deposit layer and the surface of the pattern to be etched, and a monitoring process (S3) of irradiating light to the pattern to be etched at the time of the depo process of cycle etching for executing two processes alternately and working a fine pattern and monitoring a change amount of the film thickness of the deposit layer by change of a coherent light having a specific wavelength reflected by the pattern to be etched, the depo process being for forming the deposit layer, in which a processing condi-
(Continued)

tion of processes for forming the deposit layer of the next cycle and onward of cycle etching is determined so that an indicator of the depo film thickness calculated from the change amount of the film thickness of the deposit layer monitored falls in a predetermined range compared to reference data.

15 Claims, 9 Drawing Sheets

(51) Int. Cl.
*H01L 21/308* (2006.01)
*H01L 21/67* (2006.01)
*H01J 37/32* (2006.01)
*G01B 11/06* (2006.01)

(52) U.S. Cl.
CPC .. *H01J 37/32082* (2013.01); *H01J 37/32715* (2013.01); *H01J 37/32963* (2013.01); *H01L 21/308* (2013.01); *H01L 21/3065* (2013.01); *H01L 21/67069* (2013.01); *H01L 21/67167* (2013.01); *H01L 21/67207* (2013.01); *H01L 21/67253* (2013.01); *H01L 22/26* (2013.01); *H01J 2237/24578* (2013.01); *H01J 2237/332* (2013.01); *H01J 2237/3347* (2013.01); *H01L 22/12* (2013.01)

(58) Field of Classification Search
CPC ......... H01J 2237/3347; H01J 37/32082; H01J 37/32715; H01J 37/32963; H01L 21/3065; H01L 21/30655; H01L 21/308; H01L 21/31116; H01L 21/67069; H01L 21/67167; H01L 21/67207; H01L 21/67253; H01L 22/12; H01L 22/26
USPC ....... 438/706, 708, 709, 710, 712, 714, 717, 438/719, 723; 156/345.13, 345.19, 156/345.48, 345.5
See application file for complete search history.

(56) References Cited

U.S. PATENT DOCUMENTS

| | | | |
|---|---|---|---|
| 2002/0048019 A1* | 4/2002 | Sui | G01N 21/21 356/369 |
| 2005/0140975 A1 | 6/2005 | Sakai et al. | |
| 2014/0302682 A1 | 10/2014 | Muto et al. | |

FOREIGN PATENT DOCUMENTS

| | | |
|---|---|---|
| JP | 2005127797 A | 5/2005 |
| JP | 2005302771 A | 10/2005 |
| JP | 2014204050 A | 10/2014 |
| JP | 2014232825 A | 12/2014 |
| WO | 2012023537 A1 | 2/2012 |
| WO | 2017159512 A1 | 9/2017 |

OTHER PUBLICATIONS

International Search Report of PCT/JP2018/003165 dated May 1, 2018.
Office Action dated Jan. 31, 2020 in Korean Application No. 10-2018-7036680.

* cited by examiner

FIG. 6 (a) SIGNAL INTENSITY OF SPECIFIC WAVELENGTH: I
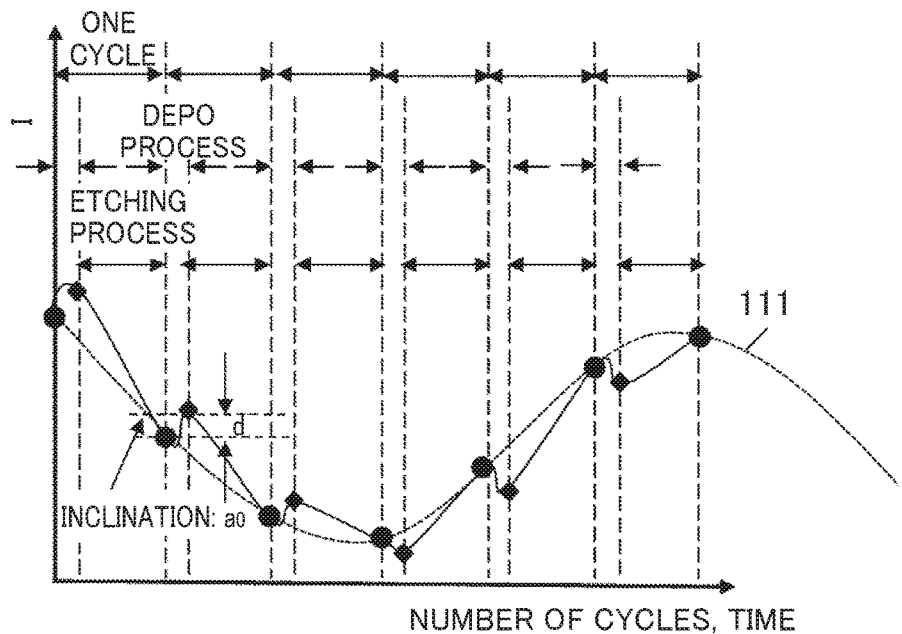
FIG. 6 (b) INDICATOR OF DEPO FILM THICKNESS: $r = |d/a_0|$
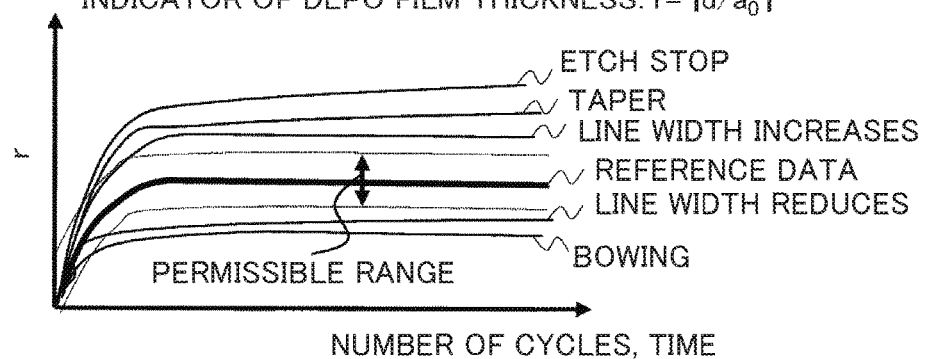
FIG. 6 (c) INDICATOR OF ETCHING AMOUNT: a
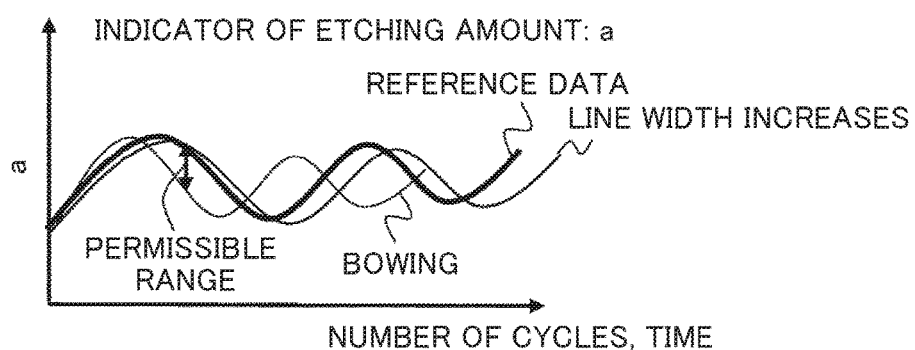

PLASMA PROCESSING METHOD AND PLASMA PROCESSING APPARATUS

TECHNICAL FIELD

The present invention relates to a plasma processing method and a plasma processing apparatus, and relates specifically to a technology suitable to plasma etching for controlling the deposition film thickness over a pattern.

BACKGROUND ART

Because of miniaturization of the functional element products such as a semiconductor element, development of the device working technology has been accelerated which uses multi-patterning such as double patterning using the side wall of the spacer of the thin film as a mask.

Accompanying it, in the working process of the device of three-dimension and the like, the technology of the trench working using various insulating material such as a thin film spacer as a mask has become important. The thickness of the mask, the gate insulation film, the etch stopper, and the like has become thin, and highly selective working of controlling the shape at an atomic layer level has been requested. Also, accompanying implementation of a three-dimensional device, a process for working a complicated shape has been increasing such as simultaneously working patterns formed in layers with different depth from the wafer surface, and working patterns whose opening dimension changes according to the depth. Conventionally, in plasma etching for working Si, an oxide film such as $SiO_2$, and a nitride film such as $Si_3N_4$, there is known a technology for etching using a gas mixture having a high deposit property such as a fluoro-carbon gas and a hydrofluoro-carbon gas in order to work fine trenches and holes with a high selection ratio with respect to the material to be etched. In this regard, in Patent Literature 1, there is disclosed a method for controlling the etching parameter so that the thickness of the deposition (will be hereinafter referred to as "depo") film over a mask becomes within a permissible value during etching.

As the dry etching technology coping with miniaturization, thinning, and high selection of the three-dimensional device of recent years, development of the cycle etching technology has been accelerated in which working is executed while repeating the depo process of forming the deposit film by a gas with high deposit property and the etching process of executing etching by ion irradiation and heat and precisely controlling the shape. However, in such cycle etching using a gas with high deposit property, although it was required to execute etching while precisely controlling the depo amount in the depo process and the etching parameter such as the ion energy in the etching process, due to the temporal change and the like of the state of the etching chamber wall and the atmosphere inside the chamber, it was hard to precisely control the depo process and the etching process stably for a long time and to execute etching into a desired shape.

On the other hand, as the film thickness measuring technology of a thin film, such technology as shown in Non-patent Literature 1 is known which measures the thickness of the adsorption film formed over a flat wafer where the pattern is not formed and the residual film thickness of the material to be etched by ellipsometry in an atomic layer etching in which the adsorption process and the desorption process are repeated.

CITATION LIST

Patent Literature

Patent Literature 1: Japanese Unexamined Patent Application Publication No. 2014-232825

Non-Patent Literature

Non-patent Literature 1: Journal of Vacuum Science & Technology A32, 020603 (2014)

SUMMARY OF INVENTION

Technical Problem

As described above, because of the depo amount and the etching shape during the cycle etching work changed by complication and miniaturization of the pattern in the three-dimensional device of recent years and the temporal change of the atmosphere inside the etching chamber, it was hard to work a pattern of a desired shape stably for a long time. In order to execute working with excellent reproducibility in the cycle etching, it is required to monitor the depo amount in the depo process and the etching amount in the etching process precisely in a short time and to adjust the etching parameter immediately.

In Patent Literature 1, the deposit film thickness deposited over the mask is measured by a film thickness measuring instrument using the coherent light reflected to the wafer upper surface direction or the absorption light. In the present prior art, with respect to the film thickness of the deposit film, a layered structure of deposit film/mask/$SiO_2$ is assumed, the absorption factor of each material is obtained beforehand, and the deposit film thickness over the mask is measured. However, in this method, when both of the deposit film thickness over the mask and the film thickness of the mask changed, it was required to prepare calibration curves beforehand with respect to the film thickness of plural masks. Also, the film thickness measured by the present prior art was the deposit film thickness over the mask, the film thickness of the deposit film could be measured when etching did not proceed by blocking of the space portion of the line-and-space pattern and the opening part of the hole pattern by the deposit film deposited excessively over the mask; however, it was hard to measure the depo film thickness including the side wall of the pattern in the pattern and to obtain information of the working shape. Further, in the cycle etching in which the depo process and the etching process were repeated in a short time of approximately 0.5 second to several tens of seconds, it was hard to monitor the depo film thickness and the etching shape in each cycle on a real-time basis and to control etching.

Next, as described in Non-patent Literature 1, there is known a method for achieving etching with the depth accuracy of an atomic layer level by repeating a process of adsorbing the material to be etched and a reaction layer having a reactive property and a process of desorbing a reaction product by ion irradiation and the like. In the present prior art, the thickness of the reaction layer and the thickness of the material to be etched are measured with the accuracy of an atomic layer level by attaching the ellipsometry to the etching chamber. The ellipsometry is known as a method for measuring the film thickness in a flat film by making a polarized incident light enter a sample to be measured and measuring the phase difference A of the s-polarized light and the p-polarized light and the reflection amplitude ratio angle tan φ of the s-polarized light and the p-polarized light. In this method, because it was required to measure the phase change of the reflection light, it was required to acquire many spectra in which polarization was changed, and it was required to measure the polarization state of the reflected coherent light. Further, in this method, although it is required to assume a layered structure of the material to be etched and the reaction layer and to obtain the refraction index and the extinction factor of each material beforehand, because the optical constant of the reaction layer formed during etching changed according to the etching gas and the etching condition, it was required to obtain the optical constant of various reaction layers beforehand. Otherwise, when some optical constants were unknown, it was required to acquire spectra of equal to or greater than the number of the unknown number at the lowest and to obtain the unknown number by fitting the simulation result modeled on the sample structure, the signal intensity of the coherent light, and the change of the polarized light. Therefore, in the present prior art, it was hard to obtain, to monitor on a real-time basis, and to feedback to the etching process the deposit film thickness and the film thickness of the material to be etched at every process of cycle etching of alternately executing the depo process and the etching process and working a microscopic pattern. Furthermore, although the film thickness could be obtained precisely with respect to the layered film whose optical constant was known, it was hard to calculate the depo film over the pattern and the working shape of the pattern to be etched.

The object of the present invention is to provide a plasma processing method and a plasma processing apparatus in which, in cycle etching, the depo film thickness formed in the depo process or the working shape formed in the etching process is monitored, and the depo film thickness or the working shape is controlled on a real-time basis.

Solution to Problem

In order to achieve the object described above, in the present invention, there is provided a plasma processing method for etching a film to be etched by repeating a depositing process for forming a deposit layer over the film to be etched and a removing process for removing a reaction product of the deposit layer and the film to be etched, including a monitoring process for monitoring a change amount of a film thickness of the deposit layer using change of a coherent light that is obtained by irradiating a polarized light polarized to a predetermined angle with respect to a mask pattern of the film to be etched and is reflected by the mask pattern.

Also, in order to achieve the object described above, in the present invention, there is provided a plasma processing apparatus including a processing chamber where a sample is plasma-processed, a film to be etched being formed over the sample, a radio frequency power source that supplies radio frequency power for generating plasma, a sample deck on which the sample is mounted, a light source that irradiates light, a polarization filter that polarizes light irradiated from the light source to a predetermined angle with respect to a mask pattern of the film to be etched, a rotation mechanism that controls the rotation angle of the polarization filter, and a control unit where a change amount of a film thickness of a deposit layer over the film to be etched is obtained using change of a coherent light that is obtained by irradiating the light polarized by the polarization filter whose rotation angle is controlled by the rotation mechanism and is reflected by the mask pattern.

Advantageous Effects of Invention

According to the present invention, it is enabled to control the etching process on a real-time basis, and a fine pattern can be stably worked highly precisely with excellent reproducibility without a fluctuation in the process.

BRIEF DESCRIPTION OF DRAWINGS

FIGS. 6(a) to 6(c) illustrate examples of the temporal change of the indicator of the depo film thickness and the indicator of the etching amount of the reference data related to the first embodiment.

DESCRIPTION OF EMBODIMENTS

Figure 1:
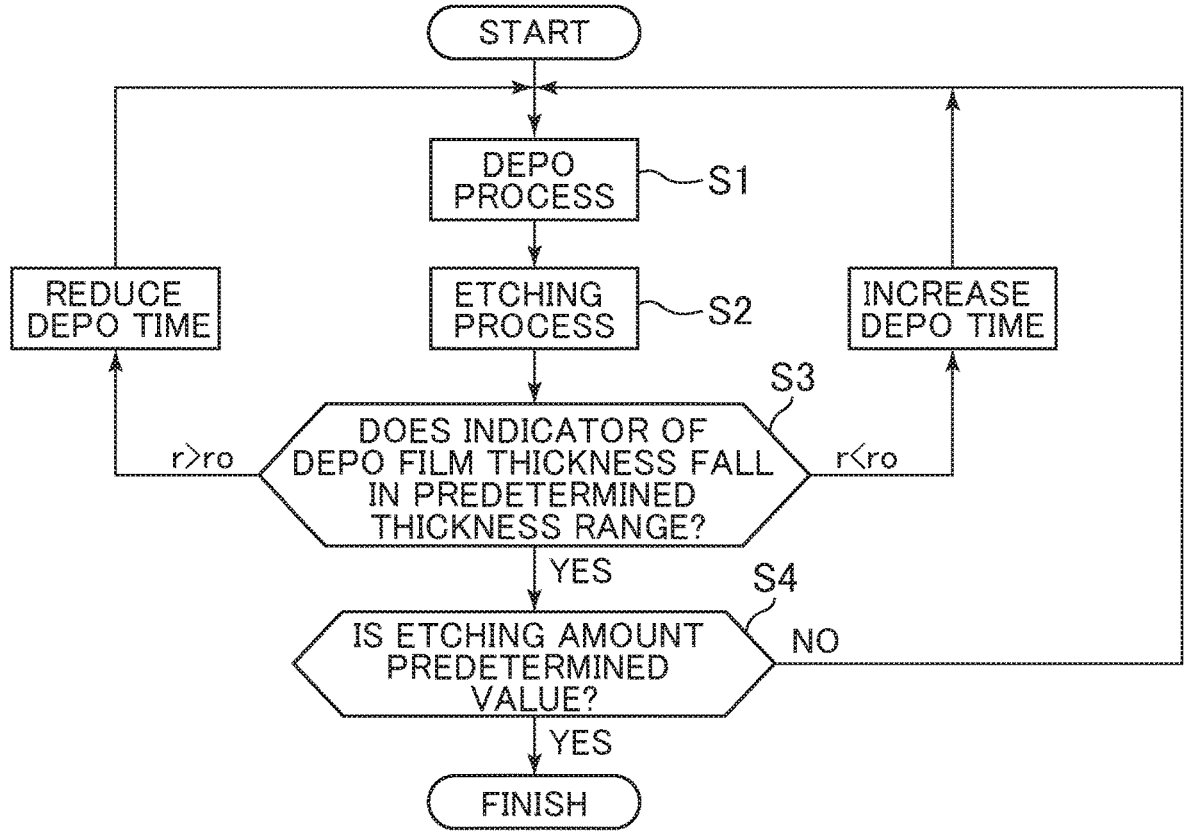
FIG. 1 is a drawing that shows an example of a process flow of an etching method of the first embodiment.

Below, embodiments of the present invention will be explained in detail using the drawings. Also, in all drawings, those having a same function are marked with a same reference sign, and repeated explanation thereof will be omitted.

The etching method of the present invention is a plasma processing method for etching a film to be etched by repeating a depositing process for forming a deposit layer over the film to be etched and a removing process for removing a reaction product of the deposit layer and the film to be etched, and further includes a monitoring process for monitoring a change amount of a film thickness of the deposit layer using change of a coherent light that is obtained by irradiating a polarized light polarized to a predetermined angle with respect to a mask pattern of the film to be etched and is reflected by the mask pattern. Thereby, the working condition of the pattern to be etched of the next cycle is adjusted on a real-time basis, and the substrate to be etched is precisely worked stably for a long time.

Also, the plasma processing apparatus of the present invention includes a processing chamber where a sample is plasma-processed, a film to be etched being formed over the sample, a radio frequency power source that supplies radio frequency power for generating plasma, a sample deck on which the sample is mounted, a light source that irradiates light, a polarization filter that polarizes light irradiated from the light source to a predetermined angle with respect to a mask pattern of the film to be etched, a rotation mechanism that controls the rotation angle of the polarization filter, and a control unit where a change amount of a change amount of a film thickness of a deposit layer over the film to be etched is obtained using change of a coherent light that is obtained by irradiating the light polarized by the polarization filter whose rotation angle is controlled by the rotation mechanism and is reflected by the mask pattern.

As described above, in the embodiments of the present invention, the monitor unit includes the rotation mechanism that rotates the polarization filter so that at least a part of a measuring area becomes an orthogonal direction to the line direction of the line-shape pattern to be etched and to make the polarized light incident, the measuring area being obtained by extracting the regularity of the pattern of the layout information of the pattern to be etched. Further, the control unit acquires the temporal change of the coherent light of plural wavelength from the reference pattern in the middle of working a desired shape as the reference data beforehand, extracts the signal intensity of the coherent light with a specific wavelength where the intensity difference with the coherent light of the real time in the depo process and the etching process becomes a constant value or more, calculates the fitting curve from the signal intensity of the coherent light at the time of finishing the etching process, calculates the indicator of the depo film thickness from the difference between the fitting curve and the signal intensity at the time of finishing the depo process, or calculates the indicator of the etching amount from the inclination of the fitting curve. When the indicator of the calculated depo film thickness or the indicator of the etching amount goes out of the predetermined range determined based on the reference data that is on the basis of the reference pattern stored in the database, the processing condition in the depo process or the etching process of the cycle of the next time and onward is determined.

First Embodiment

Figure 2:
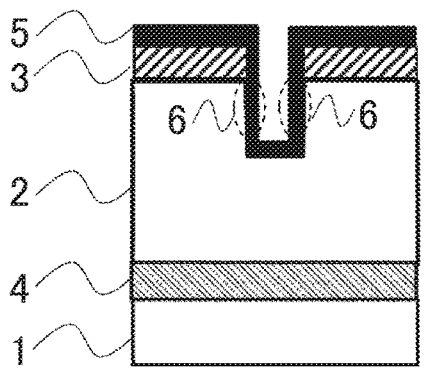
FIGS. 2(a) and 2(b) are schematic drawings for explaining a process flow of an etching method of the first embodiment.
Figure 2:
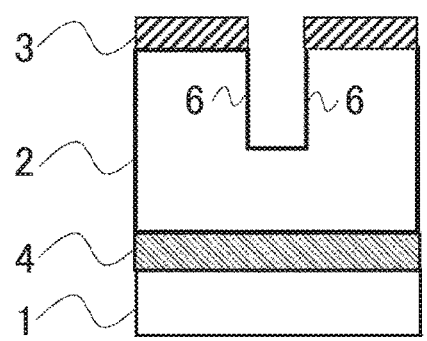

As the first embodiment, an embodiment of the cycle etching and the etching apparatus in which the depo process and the etching process are executed alternately and a fine pattern is worked will be explained. FIG. 1 is a drawing that shows an example of a process flow of the cycle etching including plural steps (S) related to the first embodiment. FIGS. 2(a) and 2(b) are schematic drawings for explaining the process flow of FIG. 1, FIG. 2(a) is an explanatory drawing of the depo process (S1) and FIG. 2(b) is an explanatory drawing of the etching process (S2). In the present embodiment, as an example of the pattern to be etched, explanation will be made for the case of etching a material to be etched 2 when inter-layer films of a non-etching layer 4 and the material to be etched 2 are formed over a wafer 1 as a substrate to be etched, and a fine line-and-space pattern that is the pattern to be etched is formed in a mask 3. Also, in the present embodiment, although explanation will be made for the case where etching is executed using energy of ions in S2, etching may be executed using other energy supply means such as heat processing.

When the process flow of FIG. 1 is started, as shown in FIG. 2(a), a depo film 5 is formed over the wafer 1 that includes the material to be etched 2 and is formed with a pattern by the mask 3 (S1). Next, ions formed by the plasma and the like are irradiated to the pattern to be etched. As shown in FIG. 2(b), at the surface of the material to be etched 2 out of the pattern to be etched, the depo film 5 and the material to be etched 2 react with each other by energy supplied from the ions, and etching proceeds (S2). On the surface to be etched of the mask 3, side walls 6, and the like, energy of the ions is lost by the depo film 5, and etching of the surface to be etched is suppressed. In the present embodiment, although the case of executing etching using energy of the ions in S2 is shown, as described above, etching may be executed using other energy supply means such as heat processing. According to the cycle etching method, formation of the depo film 5 (S1) and the etching process (S2) are made 1 cycle, and, by repeating this cycle by required number of times, the material to be etched 2 is etched to a predetermined depth.

According to the cycle etching method described above, the thickness of the depo film deposited in the depo process of one time is as thin as several atomic layers-several tens of nm, the etching depth etched in the etching process of one time is also as thin as several atomic layers-several tens of nm, and it is required to precisely control the depo film thickness and the etching amount in each process. However, the depo amount of the pattern surface is largely affected by the atmosphere inside the chamber, and, in the production site of the device, it has become a problem that the atmosphere inside the chamber changes by the deposited object and the like adhered to the etching chamber wall while a large amount of the wafers is processed and a desired working shape is not obtained.

Therefore, as shown in S3 and S4 of the process flow of FIG. 1, in the cycle etching of the present embodiment, the indicator of the film thickness of the depo film 5 deposited over the surface of the pattern to be etched and the indicator of the etching amount are monitored, and the processing condition of the depo process or the etching process is adjusted on a real-time basis. That is to say, in forming the deposit layer by the cycle etching, light polarized to a predetermined angle is irradiated to the pattern to be etched, the change amount of the film thickness of the deposit layer is monitored by change of the coherent light having a specific wavelength reflected by the pattern to be etched, the indicator of the film thickness of the depo film and the indicator of the etching amount are obtained, and the processing condition is adjusted on a real-time basis using these indicators.

Figure 3:
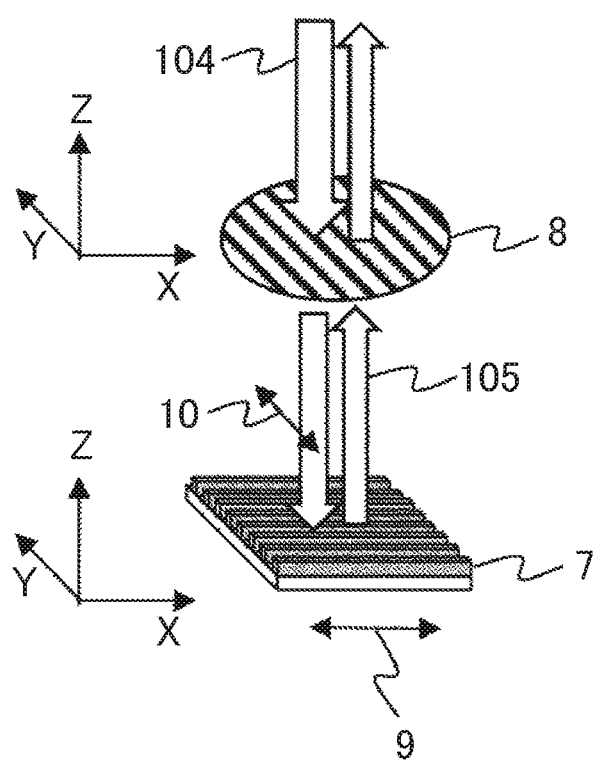
FIG. 3 is a schematic drawing that shows the relation between the polarization direction of the monitoring light and the line direction of the pattern to be etched related to the first embodiment.

FIG. 3 is a schematic drawing that shows the relation between the polarization direction of the incident light for monitoring the depo film thickness in the present embodiment and the line direction of the line-and-space pattern that is the pattern to be etched. In the present embodiment, because the depo film thickness formed over the pattern is monitored in the depo process (S1), a line direction 9 of the line-and-space pattern is extracted as information showing the regularity of a line-and-space pattern 7 formed beforehand over the mask from the layout information of the pattern to be etched, a polarization filter 8 is rotated so as to become the orthogonal direction to a line direction 9 based on the information of the line direction 9 extracted, and the polarized light is made incident. Also, based on the temporal change of the signal intensity of the coherent light having a specific wavelength reflected on the wafer, the change amount of the film thickness of the deposit layer is monitored on a real-time basis, and the indicator of the depo film thickness and the indicator of the etching amount are calculated.

For example, in such relation showing an example in FIG. 3, when the line direction 9 is X-direction, the direction of the polarization filter 8 is adjusted by rotating the polarization filter 8 to Y-direction. Thus, when light is made incident on the line-and-space pattern to such direction that the line direction 9 of the line-and-space pattern and a polarization direction 10 by the polarization filter 8 become orthogonal (90 degrees), the coherent light reflected causes a diffractive effect by the line-and-space pattern and changes sensitively responding a change of the cross-sectional shape of the line-and-space pattern, therefore the indicator of the film thickness of the depo film and the indicator of the etching amount can be calculated, and a change of the depo film thickness in the depos process and the etching shape in the etching process come to be capable of being precisely monitor-controlled using these indicators.

Figure 4:
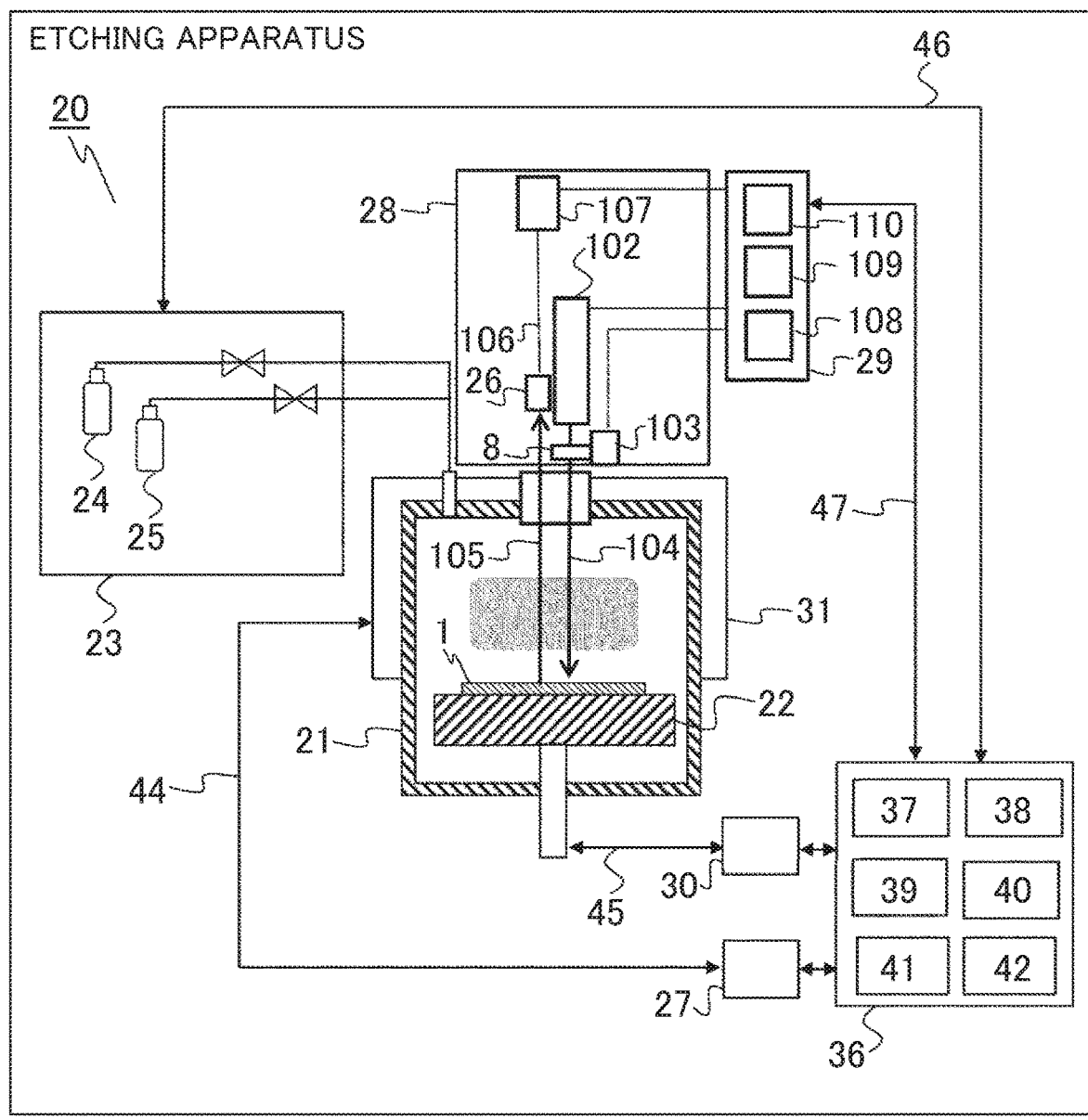
FIG. 4 is a drawing that shows an overall configuration example of an etching apparatus that is a plasma processing apparatus related to the first embodiment.

In FIG. 4, an overall configuration of an etching apparatus for achieving the cycle etching method of the present embodiment is shown. An etching apparatus 20 that is a plasma processing apparatus is configured of a processing chamber 21, a gas supply unit 23, a monitor unit 28, a monitor control unit 29, an apparatus control unit 36, and so on. The monitor control unit 29 including a control unit 108, a calculation unit 109, and a database 110 and the apparatus control unit 36 including plural mechanism blocks are achieved by execution of a program of a computer including a central processing unit (CPU), a storage unit, and the like respectively, and the both are connected to each other by a control line 47. Also, the apparatus control unit 36 functions as a function block of a gas control unit 37, an exhaust system control unit 38, a radio frequency control unit 39, a bias control unit 40, a storage unit 41, a clock 42, and so on. These function blocks can be achieved by one set of the personal computer (PC) as described above. Further, in the present description, there is a case where the monitor control unit 29 and the apparatus control unit 36 are collectively referred to simply as a control unit.

In the etching apparatus 20, a wafer stage 22 arranged inside the processing chamber 21 and the gas supply unit 23 including gas cylinders and valves are arranged, each of a depo process gas 24 and an etching process gas 25 is supplied to the processing chamber 21 in the process step shown in FIG. 1 based on a control signal 46 from the apparatus control unit 36. The process gas supplied is decomposed to plasma in the inside of the processing chamber 21 by radio frequency power 44 generated by a radio frequency power source 27 and applied to a radio frequency application unit 31. Also, the pressure inside the processing chamber 21 can be kept constant by a variable conductance valve and a vacuum pump in a state the process gas of a desired flow rate is made to flow, the variable conductance valve and the vacuum pump being connected to the processing chamber 21, illustration of the variable conductance valve and the vacuum pump being omitted.

First, when the depo process (S1) starts, the depo process gas 24 is supplied to the processing chamber 21 at a predetermined flow rate based on the control signal 46. The depo process gas 24 supplied becomes plasma by the radio frequency power 44 applied to the radio frequency application unit 31, and is decomposed into radicals, ions, and the like. The radicals and the ions formed by the plasma reach the surface of the wafer 1, and form the depo film 5 shown in FIG. 2(a). Next, when the etching process (S2) starts, the etching process gas 25 is supplied to the processing chamber 21 at a predetermined flow rate. The gas 25 supplied becomes plasma by the radio frequency power 44 applied by the radio frequency application unit 31, is decomposed into radicals and ions, and is irradiated to the surface of the wafer 1. At this time, when etching is executed by the ions irradiated from the plasma, it is possible to apply a bias voltage 45 supplied from a bias power source 30 to the wafer stage 22 for example and to control ion energy.

The kind of the gas used in each process is selected appropriately according to the pattern material for which the etching process is executed. For example, as the depo process gas 24, a gas mixture of a fluorocarbon gas and a hydrofluorocarbon gas such as $C_4F_8$ and $CH_3F$, a rare gas, and $O_2$-, $CO_2$-, $N_2$-gas and the like can be used. At this time, as the etching gas, for example, a gas mixture of a fluorocarbon gas and a gas such as Ar, He, Ne, Kr, and Xe, and $O_2$, $CO_2$, $CF_4$, $N_2$, $H_2$, anhydrous HF, $CH_4$, $CHF_3$, $NF_3$, $SF_3$, and the like can be used. Also, for example, when a gas mixture of HBr, $BCl_3$ and the like, a rare gas, and $Cl_2$-, $O_2$-, $CO_2$-, and $N_2$-gas and the like is used as the depo process gas 24, as the etching gas 25, a gas mixture of HBr, $BCl_3$, and the like, a rare gas such as Ar, He, Ne, Kr, and Xe, and $Cl_2$, $O_2$, $CO_2$, $CF_4$, $N_2$, $H_2$, anhydrous HF, $CH_4$, $CHF_3$, $NF_3$, $SF_3$, and the like can be used for example.

Figure 5:
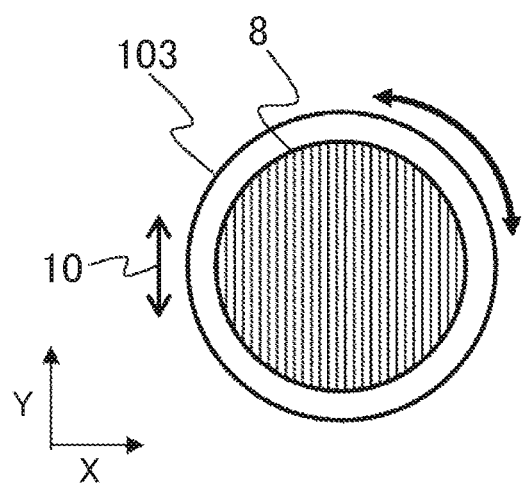
FIGS. 5(a) and 5(b) are explanatory drawings of the notch direction of the wafer of the apparatus, the line-and-space pattern, and the rotation direction of the polarization filter related to the first embodiment.
Figure 5:
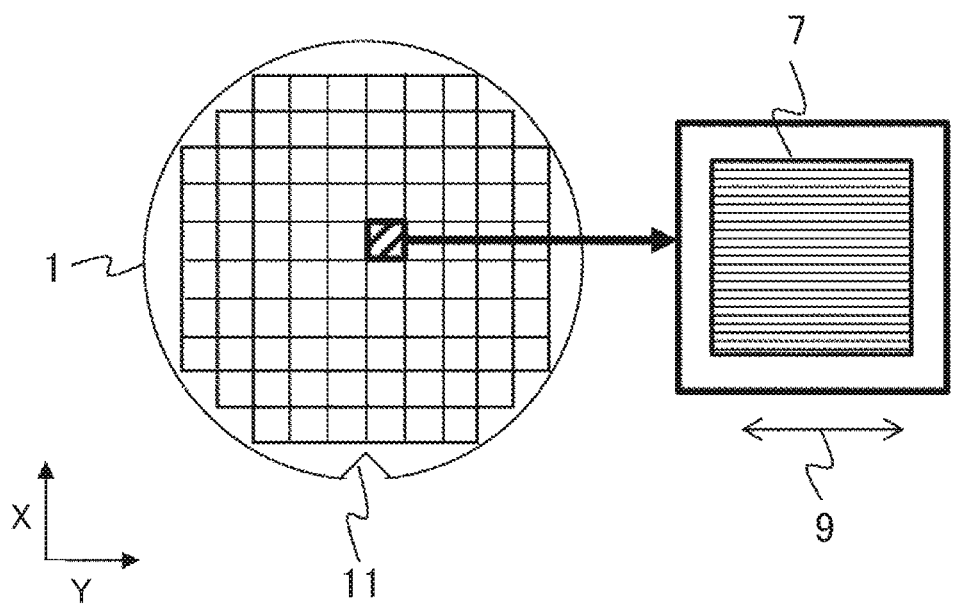

Next, one concrete example of a method for monitoring the indicator of the depo film thickness and the indicator of the etching amount during the cycle etching process by the monitor unit 28 and the monitor control unit 29 in the configuration of the etching apparatus of the present embodiment will be explained. FIGS. 5(a) and 5(b) are drawings for explaining the relation of the notch direction of the wafer 1, the line direction 9 of the line-and-space 7, and the rotation direction of the polarization filter 8. First, the wafer 1 where the reference pattern of a desired shape is patterned as the reference data is introduced to the processing chamber 21. As shown in FIG. 5(b) of the drawing, the direction of a notch 11 or the direction of the orientation flat of the wafer introduced to the processing chamber is disposed in a direction having been set beforehand. The relation between the direction of the notch 11 or the orientation flat of the wafer and the line direction 9 of the reference pattern is stored beforehand as the wafer information in the database 110 of the monitor control unit 29, the storage unit 41 of the apparatus control unit 36, and so on.

In the monitor unit 28, light generated from a monitor light source 102 is polarized by the polarization filter 8 whose rotation is controlled by a rotation mechanism 103, and is irradiated on the reference pattern over the wafer 1. At this time, as the monitor light source 102, light with the wavelength range of 190 nm to 900 nm for example is used. The polarization filter 8 rotates using the rotation mechanism 103 and can adjust the polarization direction 10 based on control of the monitor control unit 29 according to the information of the line direction 9 of the line-and-space pattern 7 of the wafer. Here, the polarization direction 10 of an incident light 104 after passing through the polarization filter 8 is adjusted to be orthogonal to the line direction 9 of the line-and-space pattern 7 of the reference pattern according to the wafer information stored in the storage unit 41 of the apparatus control unit 36.

Then, at the same time etching is started, monitoring of the reference pattern over the wafer 1 is started. The light generated from the monitor light source 102 is polarized by the polarization filter 8 and is irradiated on the reference pattern over the wafer 1. Because the line direction 9 of the line-and-space pattern 7 formed over the wafer 1 is normally X-direction or Y-direction with respect to the notch of the wafer, the polarization direction 10 of the polarization filter 8 may be adjusted beforehand to X-direction or Y-direction according to the information of the wafer 1. Next, a coherent light 105 reflected by the reference pattern passes through a detection unit 26 and an optical fiber 106 of the monitor unit 28, and is dispersed by a spectral apparatus 107. At this time, with respect to the coherent light dispersed by the spectral apparatus 107, by being made to pass through again the polarization filter 8 that has polarized the incident light 104, only the light polarized in one direction may be detected. In the spectral apparatus 107 of the monitor unit 28, the temporal change of the signal intensity of the coherent light having predetermined plural wavelengths is measured. The indicator of the depo film thickness and the indicator of the etching amount at the reference pattern are calculated by the calculation unit 109 of the monitor control unit 29 from the temporal change of the signal intensity of the coherent light having at least one specific wavelength having been measured.

In FIG. 6(a), there is shown an example of the temporal change of the signal intensity (I) having a specific wavelength of the coherent light acquired as the reference data using the reference pattern using the configuration of the present embodiment. In the case of the present example, when etching is started, the signal intensity increases in the depo process (S1), and the signal intensity reduces in the etching process (S2). In the present embodiment, based on the temporal change of the signal intensity (I) of a specific wavelength of the coherent light acquired as this reference data, the thickness and the etching shape of the depo film 5 are controlled and the pattern of a desired shape is stably formed in S3 and S4 of the cycle etching method of FIG. 1. Therefore, the monitor control unit 29 acquires beforehand the temporal change of the coherent light having plural wavelengths in the middle of working the desired shape as the reference data, and extracts the signal intensity of the coherent light having a specific wavelength where the signal intensity difference of the coherent light in the depo process (S1) and the etching process (S2) becomes maximum for example.

Here, one concrete example of the calculation method for the indicator of the depo film thickness and the indicator of the etching amount used in determination of S3 and S4 of the process flow by the calculation unit 109 will be explained. Also, each indicator calculated is stored in the database 110 as the reference data. That is to say, by storing as the reference data the indicator of the depo film thickness and the indicator of the etching amount calculated based on the change of the coherent light of this specific wavelength reflected by the reference pattern of the pattern to be etched and comparing the indicator of the depo film thickness or the indicator of the etching amount calculated from the change amount of the film thickness of the deposit layer monitored and these stored reference data, the processing condition of the next cycle and onward can be determined.

As shown in FIG. 6(a), in an example of the signal intensity (I) of the coherent light from the reference pattern, first, the signal intensity increases in the depo process and the signal intensity reduces in the etching process. When etching proceeds further, the signal intensity reduces in the depo process and the signal intensity increases in the etching process. Also, we found out that a fitting curve 111 of the signal intensity of the coherent light having a specific wavelength at the time of completion of the etching process changed depending on the information of the working shape of the pattern to be etched after completion of the etching process and that the difference of this fitting curve 111 and the signal intensity after completion of the depo process depended on the thickness of the depo film formed in the depo process.

Further, as a result of monitoring an absolute value $|d/a_0|$ of a value obtained by standardizing the difference d between the signal intensity at the time of completion of the etching process of the (n−1)-th cycle and the signal intensity at the time of completion of the depo process of the n-th cycle by the inclination $a_0$ of the fitting curve as an indicator r of the depo film thickness as shown in FIG. 6(b) as an example of the indicator r of the depo film thickness, the relation between the change of the indicator of the depo film thickness and the cross-sectional shape after etching was found out. The reference data in the drawing shows the temporal change of the indicator of the depo film thickness calculated based on the reference pattern. Based on this relation, the indicator of the depo film thickness can be calculated from the difference between the signal intensity of the coherent light having a specific wavelength at the time of completion of the etching process and the signal intensity of the coherent light having the specific wavelength at the time of completion of the depo process to follow. Thereby, in the monitoring process, based on the difference between the signal intensity of the coherent light of the etching process and the signal intensity of the coherent light of the depo process, the change amount of the film thickness of the deposit layer can be monitored.

Also, as shown in FIG. 6(c), it was found out that, when the amplitude and the cycle length which are the shape of the fitting curve 111 of the signal intensity at the time of completion of the etching process or, in other words, the signal intensity (amplitude) of the fitting curve or the cycle length of the fitting curve at a predetermined time shifted from a desired shape of the fitting curve based on the reference pattern, the shape of the fitting curve changed according to the cross-sectional shape. As a result, the indicator of the etching amount can be calculated based on the amplitude and the cycle length of the fitting curve of the signal intensity of the coherent light having a specific wavelength.

FIGS. 7(a) to 7(f) are explanatory drawings for an example of various cross-sectional shape of a pattern to be etched, and Table 1 is a table that shows an example of the category of the cross-sectional shape of the etching pattern determined from the indicator of the depo film thickness and the indicator of the etching amount, the adjustment method for the processing parameter of the depo process, and the adjustment method for the processing parameter of the etching process.

TABLE 1

| Indicator of depo film thickness | Indicator of etching amount | Category determination of cross-sectional shape | Adjustment of depo process parameter | Adjustment of etching process parameter |
| --- | --- | --- | --- | --- |
| $r > r_{01}$ | Cycle length $S > S_1 \approx \infty$ Amplitude I < $I_1 \approx 0$ | Etch stop | Reduction of time or small flow rate ratio of sedimentary gas/entire | Increase of time or increase of bias voltage or increase of bias |

TABLE 1-continued

| Indicator of depo film thickness | Indicator of etching amount | Category determination of cross-sectional shape | Adjustment of depo process parameter | Adjustment of etching process parameter |
|---|---|---|---|---|
| | | | gas | voltage on/off time ratio |
| $r > r_{02}$ | Amplitude I < $I_2$ | Taper | Reduction of time or small flow rate ratio of sedimentary gas/entire gas | Increase of time or increase of bias voltage or increase of bias voltage on/off time ratio |
| $r > r_{03}$ | Cycle length $S > S_3$ | Line width increases | Reduction of time or small flow rate ratio of sedimentary gas/entire gas | Increase of time or increase of bias voltage or increase of bias voltage on/off time ratio |
| $r > r_{04}$ | Cycle length $S < S_4$ | Line width reduces | Increase of time or large flow rate ratio of sedimentary gas/entire gas | Reduction of time or drop of bias voltage or drop of bias voltage on/off time ratio |
| $r > r_{05}$ | Amplitude I < $I_5$ | Bowing | Increase of time or large flow rate ratio of sedimentary gas/entire gas | Reduction of time or drop of bias voltage or drop of bias voltage on/off time ratio |

Figure 7:
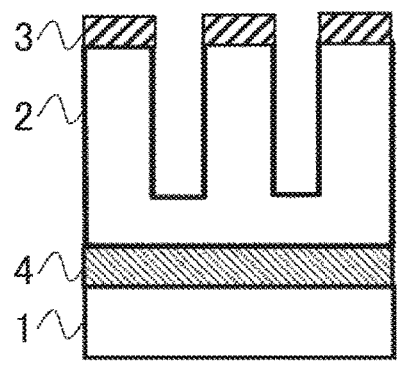
FIGS. 7(a) to 7(f) are schematic drawings for explaining the indicator of the etching amount of the first embodiment.
Figure 7:
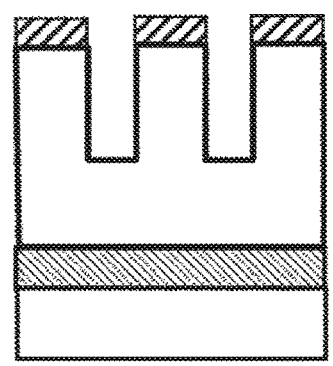
Figure 7:
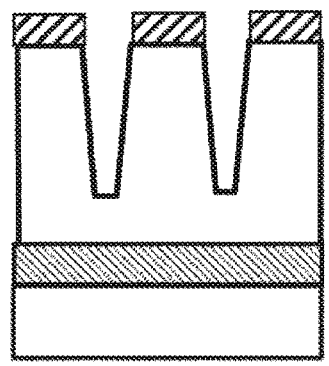
Figure 7:
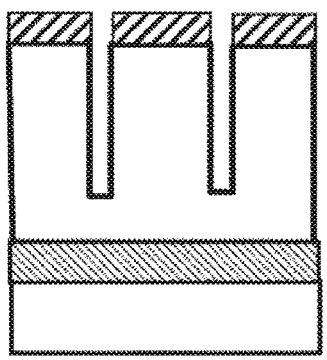
Figure 7:
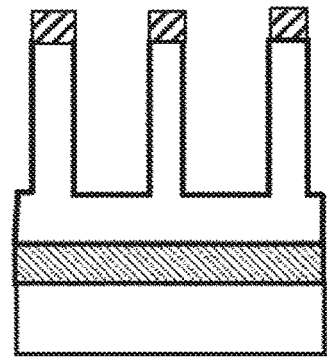
Figure 7:
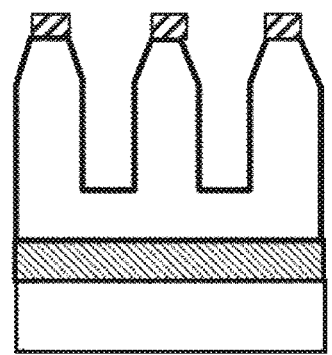

For example, when the cross-sectional shape of the reference pattern is a perpendicular pattern shown in FIG. 7(a) and when the indicator of the depo film thickness is larger than a designated permissible range $r_{01}$ and the change of the indicator of the etching amount is less than a designated value $I_1$, the cross-sectional shape of the actual etching pattern can be determined to be the etch stop of FIG. 7(b) for example. Also, when the indicator of the depo film thickness is larger than a designated permissible range $r_{02}$ and the change of the indicator of the etching amount namely the change of the amplitude is less than a designated value $I_2$ for example, the cross-sectional shape can be determined to be the tapered shape of FIG. 7(c) for example. In a similar manner, when the indicator of the depo film thickness is larger than a designated permissible range $r_{03}$ and the change of the indicator of the etching amount namely the change of the cycle length is larger than a designated value $S_3$ for example, the cross-sectional shape can be determined for example to be a cross-sectional shape where the line width of FIG. 7(d) increases, and when the indicator of the depo film thickness is less than a designated permissible range $r_{04}$ and the change of the indicator of the etching amount namely the change of the cycle length is less than a designated value $S_4$ for example, the cross-sectional shape can be determined for example to be a cross-sectional shape where the line width of FIG. 7(e) reduces. Also, when the indicator of the depo film thickness is less than a designated permissible range $r_{05}$ and the change of the indicator of the etching amount namely the change of the amplitude is less than a designated value $I_5$ for example, the cross-sectional shape can be determined for example to be a bowing cross-sectional shape of FIG. 7(f).

Therefore, in the etching apparatus 20 of the present embodiment, the coherent light spectrum, the indicator of the depo film thickness, and the indicator of the etching amount of the reference pattern accumulated in the database 110 and the coherent light spectrum, the indicator of the depo film thickness, and the indicator of the etching amount which are the actual monitoring results are compared to each other by the monitor control unit 29. This comparison is executed by the calculation unit 109 of the monitor control unit 29. When the comparison result deviates from the specific range shown by the permissible range of FIG. 6 for example, the control unit 108 adjusts/determines the processing condition of the depo process (S1) and the etching process (S2) of the cycles of the next time and onward, and controls so that the processing condition after being adjusted/determined is transmitted to the apparatus control unit 36.

Next, a case of monitoring the change amount of the film thickness of the deposit layer, monitoring the indicator of the depo film thickness and the indicator of the etching amount of the pattern to be etched, and controlling etching on a real-time basis by the etching apparatus of the present embodiment shown in FIG. 4 will be explained. First, the wafer 1 where a pattern similar to the reference pattern is patterned as a wafer to be etched is introduced to the processing chamber 21, the reference pattern being measured beforehand, the reference data being stored in the reference pattern. At this time, the notch 11 or the orientation flat of the wafer 1 is disposed at a position set beforehand. The relation between the direction of the notch 11 or the orientation flat of the wafer and the line direction 7 of the reference pattern is stored beforehand in the storage unit 41 of the apparatus control unit 36 as the wafer information. With respect to the polarization filter 8, similarly to the time when the reference pattern was monitored, the rotation angle of the polarization filter 8 is adjusted by the rotation mechanism 103 by control of the monitor control unit 29 so as to become orthogonal to the line-and-space pattern 7 of the pattern to be etched according to the wafer information of the wafer that is a substrate to be etched stored in the storage unit 41.

At the same time etching of the wafer to be etched is started, monitoring of the pattern to be etched by the monitor unit 28 is started. Similarly to the case of acquiring the reference data before, the incident light 104 generated from the monitoring light source 102 of the monitor unit 28 is polarized by the polarization filter 8, and is irradiated on the pattern to be etched over the wafer 1. Next, similarly to the case of acquiring the reference data, the coherent light 105 reflected by the wafer 1 passes through the detection unit 26 and the optical fiber 106, and is measured by the spectral apparatus 107. In the spectral apparatus 107, the temporal change of the signal intensity of the coherent light having a specific wavelength determined when the reference data were acquired beforehand is monitored. From the temporal change of the coherent light having the specific wavelength monitored by the monitor unit 28, the calculation unit 109 calculates the indicator of the depo film thickness and the indicator of the etching amount similarly to the reference data before.

Figure 8:
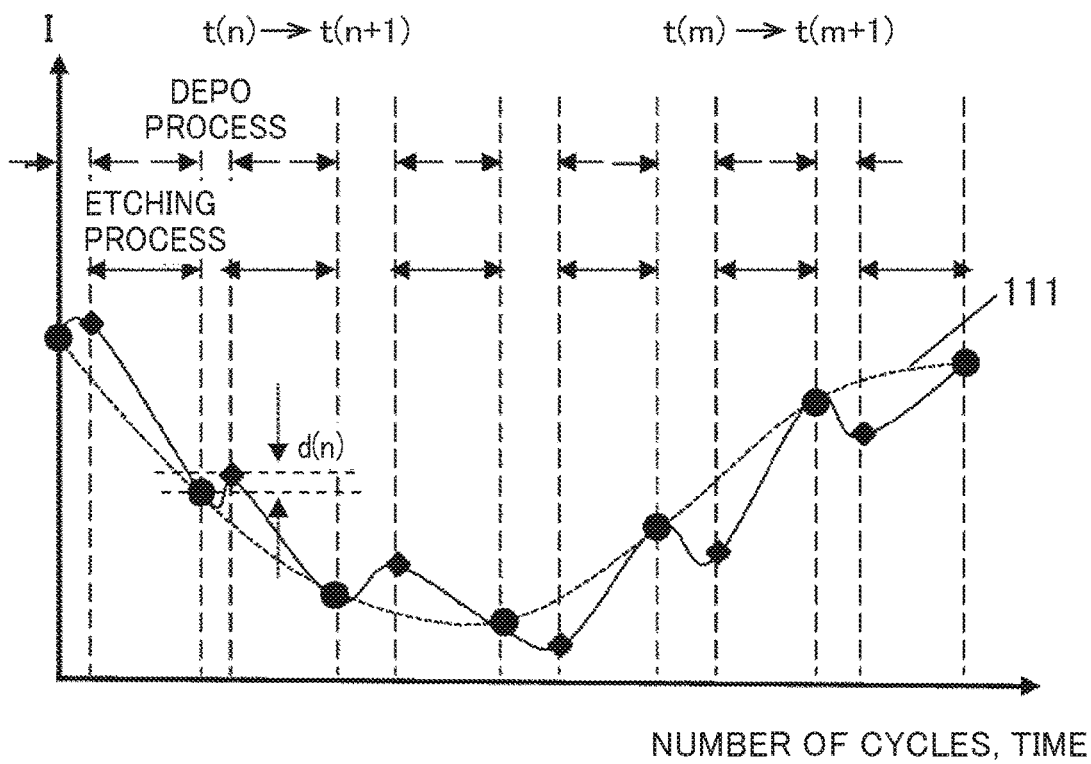
FIGS. 8(a) and 8(b) show a calculation method for the indicator of the depo film thickness of the first embodiment and an example of the monitoring result thereof.
Figure 8:
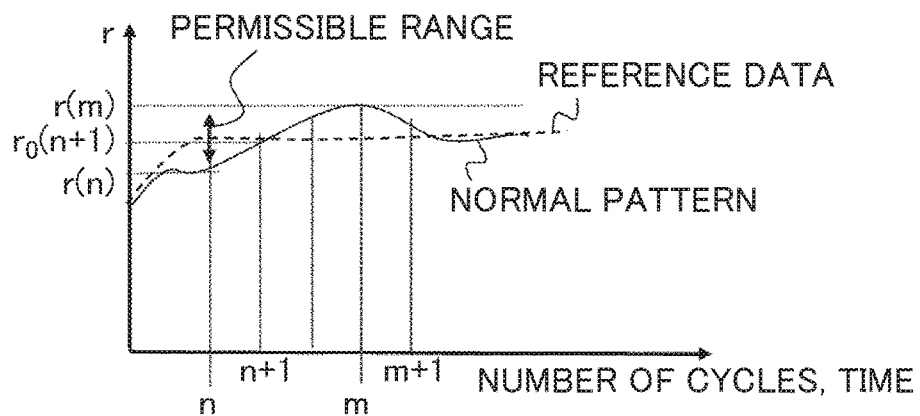

In FIGS. 8(a) and 8(b), there is shown an example of a case, when the indicator of the depo film thickness becomes a value deviating from a specific range, the process condition of the depo process is adjusted namely the indicator of the depo film thickness of the pattern to be etched is monitored, the time of the depo process is adjusted on a real-time basis, and etching is executed while being controlled to have a desired etching shape. FIG. 8(a) shows an example of the temporal change of the signal intensity (I) of the coherent light having a specific wavelength similarly to FIG. 6(a), and an example of the temporal change of the indicator r of the depo film thickness is shown in FIG. 8(b). For example, when the indicator r (n) of the depo film of the n-th cycle is small exceeding the permissible range of r(n), the depo time t(n+1) of the depo process of the (n+1)-th cycle is determined for example by the control unit 108 as follows.

Figure 9:
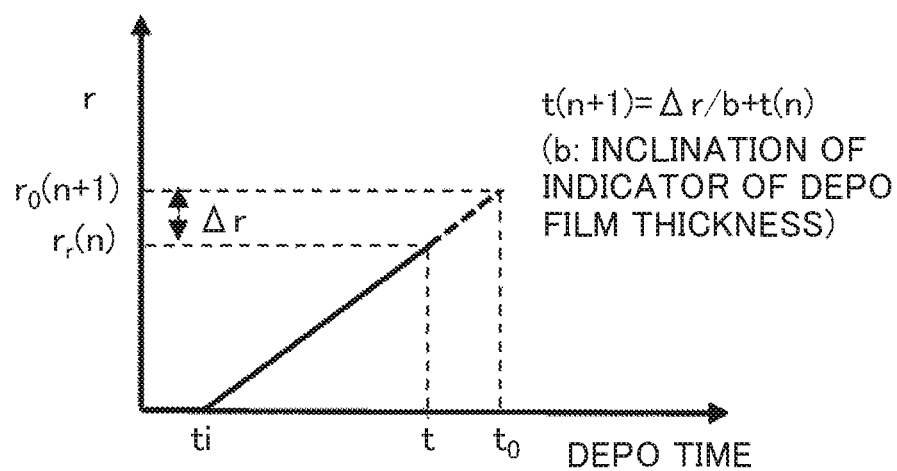
FIG. 9 is an explanatory drawing of an example of the adjusting method of the depo process time of the first embodiment.

In FIG. 9, as an example of the adjusting method for the depo time of the depo process, there is shown the temporal change of the indicator r of the depo film thickness within the depo process of the n-th cycle of the reference data. When a value required as the indicator of the depo film thickness of the (n+1)-th time is made $r_0(n+1)$, the difference of $r_0(n+1)$ and r(n) is made Δr, the processing time of the depo process of the n-th time is made t, and the inclination of the indicator of the depo film thickness at the time t is made b, the processing time of the (n+1)-th time t(n+1) can be determined as (Δr/b+t(n)). Thus, when the time of the depo process of the (n+1)-th time was adjusted, the indicator r(n+1) of the depo film thickness of the (n+1)-th time could be controlled to within the permissible range of the indicator of the depo film of the (n+1)-th time. Further, also in the case where the indicator r(m) of the depo film became large in the m-th time exceeding the predetermined range illustrated as the permissible range as shown in FIG. 8(b), the depo film thickness could be controlled to within a desired range by adjusting the processing time of the depo process of the (m+1)-th time from the measured value of the temporal change of the indicator of the depo film thickness within the depo process of the m-th time. Because of the configuration of the present embodiment, by adjusting the depo time so that the indicator of the depo film thickness became within the predetermined range in each cycle, it was enabled to control the etching shape to execute etching for a long time with excellent reproducibility.

Thus, when the indicator of the depo film thickness has been determined to deviate from the predetermined range, as the processing parameter to be adjusted other than the time of the depo process, as shown in ice, there is the mixing ratio of the etching gas and the like for example, and a means for adjusting it can be arranged. For example, when the ratio of the sedimentary gas and the entire gas flow rate is to be adjusted as the mixing ratio of the etching gas, a data file that has acquired beforehand the relation against the change amount of the indicator of the depo film thickness of the case where the flow rate ratio of the etching gas is changed is kept in the storage unit 41, a portion of the difference Δr of the indicator r of the depo film thickness measured and the predetermined value $r_0$ is changed, and the gas flow rate ratio that allows the indicator of the depo film thickness to fall in the predetermined range is calculated by the calculation unit 109. The gas flow rate ratio calculated was transferred to the gas control unit 37, and it was enabled to control the gas flow rate ratio.

On the other hand, when the indicator of the etching amount was determined to deviate from the predetermined range in spite that the indicator of the depo film thickness was within the predetermined range, by a means for adjusting the time of the etching process, the wafer bias voltage, and the wafer temperature for example, it was enabled to precisely control the etching shape. For example, when the wafer bias voltage of the etching process is to be adjusted by the bias control unit 40, the wafer bias voltage can be fine-adjusted so that the indicator of the etching amount falls in the predetermined range as shown in the column of adjustment of the etching process parameter of Table 1. The adjustment value of the wafer bias voltage 45 calculated by the calculation unit 109 is transferred to the bias control unit 40, and the bias power source 30 can be adjusted to a predetermined value. In a similar manner, fine adjustment can be executed by increasing/decreasing the time of the etching process using the radio frequency control unit 39 and the like.

Figure 10:
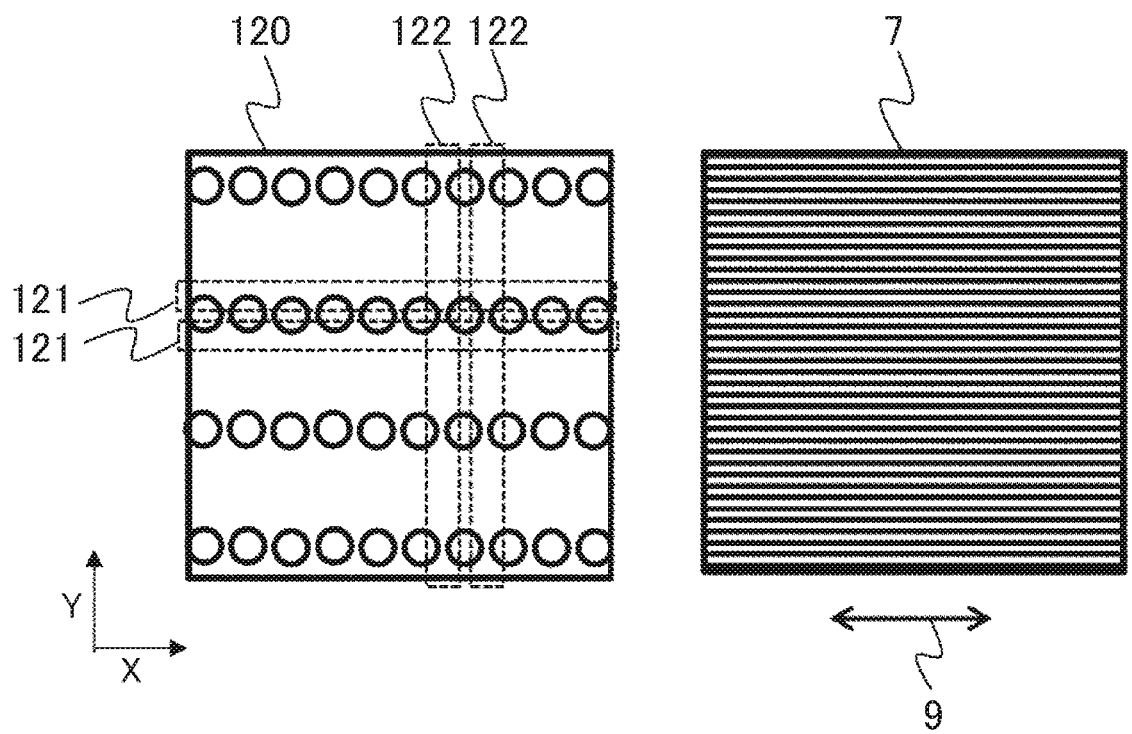
FIG. 10 is an explanatory drawing of an example of the polarization direction of light of a case where the pattern to be etched of the first embodiment is a hole pattern.

In the present embodiment described above in detail, a case where the pattern to be etched was a line-and-space pattern was explained for example. However, the configuration of the present embodiment is not necessarily implemented so as to be limited only to a line-and-space pattern. For example, as shown in FIG. 10, the configuration of the present embodiment can be implemented also to a case where the pattern to be etched is a hole pattern. An explanatory drawing for an example of a method for setting the polarization direction of the incident light of this case is shown. As shown in FIG. 10, when the pitch of a hole pattern 120 is different between x-direction and Y-direction, namely when the pitch of one direction in the hole pattern is smaller than the pitch of the other direction in the hole pattern, the incident light is polarized orthogonal to the pitch of one direction, and monitors the change amount of the film thickness related to the deposit layer of the side wall of the hole pattern on the side of the other direction. For example, by adjusting rotation of the polarization filter 8 so that the direction along which the pitch is small namely X-direction becomes orthogonal to the polarization direction 10 of the incident light 104, the indicator of the depo film thickness and the indicator of the etching amount with respect to a side wall 121 with a larger pitch can be precisely monitored.

However, when a fine pattern is to be worked, there is also a case where it is necessary to control a side wall shape 122 in the direction with a smaller pitch more precisely. In such case, highly precise monitoring became possible by adjusting the rotation angle of the polarization filter 8 so that the direction with a larger pattern pitch namely Y-direction became orthogonal to the polarization direction 10 of the incident light 104. Moreover, it is also possible to monitor the depo film and the etching shape of the hole with high sensitivity by rotating the polarization filter 8 to X-direction and Y-direction alternately at a high speed by the rotation mechanism 103 and alternately measuring the signal intensity of the coherent light in irradiating the incident light polarized to X-direction and the signal intensity of the coherent light in irradiating the incident light polarized to Y-direction.

By the configuration of the present embodiment, it is enabled to calculate the indicator of the depo film thickness or the indicator of the etching amount from the change amount of the film thickness of the deposit layer monitored by the monitor unit, to determine the processing condition of the depo process or the etching process of the next cycle and onward of the cycle etching based on the indicator of the depo film thickness or the indicator of the etching amount having been calculated, and to process the substrate to be etched with the determined processing condition.

Second Embodiment

Figure 11:
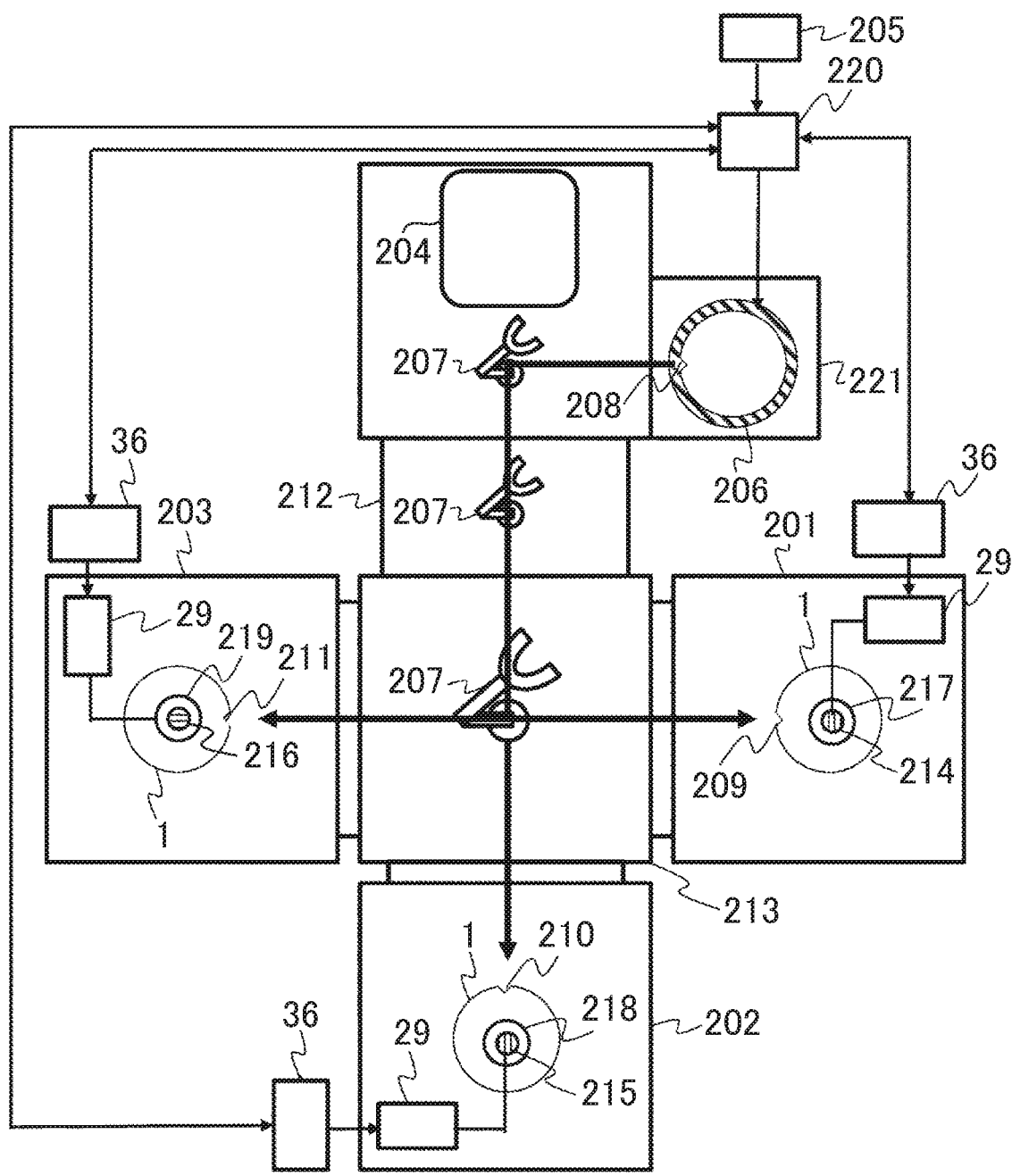
FIG. 11 is a drawing that shows an example of an overall configuration of the cluster type etching tool related to the second embodiment.

Next, a plasma processing apparatus configured of a cluster type etching tool (will be hereinafter referred to as a cluster tool) of the second embodiment will be explained using FIG. 11. FIG. 11 is a drawing that shows a configuration of the cluster tool of the second embodiment. As an example of the cluster tool, a case of configuring the processing chamber of the etching apparatus by three chambers will be shown. In addition to three processing chambers, the cluster tool includes a wafer cassette loader 204, a control PC 205, a convey robot 207, a control unit 220, and a notch position adjustment stage 221. In the configuration of the present embodiment, the control PC, the control unit 220, and the three monitor control units 36 can be collectively referred to as a control unit of the cluster tool.

In the present cluster tool, when the wafer cassette is set to the wafer loader 204, based on the process recipe having been set beforehand by the control PC 205, the wafer 1 for processing is conveyed from the wafer cassette onto a rotation deck 206 of the notch position adjustment stage 221 for notch position alignment by the convey robot 207. In the rotation deck 206, the direction of the notch 11 is aligned to a predetermined direction 208 under control of the control unit 220 according to information of the processing chamber in which the notch position of the wafer 1 for processing is designated by the processing recipe. When alignment of the notch has been completed, the wafer 1 for processing is conveyed from the rotation deck 206 to a load lock chamber 212 by the convey robot 207.

When the wafer 1 is conveyed to the load lock chamber 212, the load lock chamber 212 is pumped to a predetermined degree of vacuum. When the load lock chamber 212 is pumped to the predetermined degree of vacuum, the wafer 1 for processing is conveyed to a convey chamber 213. Thereafter, the wafer 1 for processing is conveyed into a designated processing chamber, and is introduced so that the notch is oriented to a designated direction inside the processing chamber. While the wafer 1 is conveyed into the processing chamber 1 for example, pattern information over the wafer inputted to the control PC 205 is read. Information of the line direction 9 of the measurement pattern at the irradiation point of the incident light is extracted from the pattern information having been read, a notch direction 209, 210, 211 within the processing chamber, and information of the irradiation position the incident light for monitoring having been set beforehand, and a rotation angle 214, 215, 216 of the polarization filter is rotated by a rotation mechanism 217, 218, 219 respectively to an angle that makes the polarization direction 10 of the incident light orthogonal namely 90 degrees to the direction of the line-and-space pattern. The relative positional relation of the notch position 209, 210, 211 of the wafer, the irradiation position of the incident light, and the angle 214, 215, 216 of the polarization filter should be same for the processing chamber 1, 2, 3. Usually, because the direction of the line-and-space pattern formed over the wafer is parallel or orthogonal to the notch direction, such mechanism capable of easily rotating the rotation direction of the polarization filter to 2 directions of 0° or 90° may be arranged. Also, the processing chamber 1, 2, 3 is not limited to the dry etching apparatus, and may be a deposition apparatus such as an atomic layer deposition apparatus.

Next, an example of the adjusting method for the irradiation position of the incident light and the position of the detection fiber of a case where the pattern area for monitoring the depo film thickness is approximately several square millimeters or less and fine adjustment of the measuring position is necessary will be described. In the present embodiment, the light source 102 and the optical fiber 106 for detection detecting the coherent light are installed on a movable stage whose stage position can be finely adjusted in the X-axis direction and Y-direction. After the wafer for processing is conveyed to the processing chamber 1, the wafer is fixed to the stage of the processing chamber. First, the light emitted from the monitor light source 102 is irradiated to the measurement pattern, and the irradiation position is confirmed by a measuring position aligning camera. As the position aligning camera, a small sized camera such as a CCD camera and a CMOS camera can be used. The image of the measuring position captured by the camera is displayed on the control PC 205. When the irradiation position deviates from the desired measurement pattern, a pattern layout drawing of the wafer information is displayed on the control PC 205, the positional shifting is calculated by designating the position of irradiation of the pattern on which the incident light irradiates at present and the position of the desired measurement pattern, and the XY stage can be adjusted to a desired position by the monitor control unit 29.

In the configuration of the present embodiment, after adjusting the monitor light source to a desired position and irradiating the incident light 104 to the measurement pattern, the pattern with a desired shape can be formed stably for a long time with excellent reproducibility by monitoring the indicator of the depo film thickness and the indicator of the etching amount on a real-time basis using the method described in the first embodiment.

Also, the present invention is not limited to the embodiments described above, and includes various modifications. For example, the embodiments described above were explained in detail for better understanding of the present invention, and are not necessarily limited to those including all configurations explained. Also, a part of a configuration of an embodiment can be replaced with a configuration of another embodiment, and a configuration of an embodiment can be added with a configuration of another embodiment. Further, with respect to a part of a configuration of each embodiment, addition, deletion, and replacement of other configurations are possible. Furthermore, with respect to respective configurations and functions as well as various kinds of the control units and so on described above, although an example of working out a program achieving some or all of them was explained, it is needles to mention that some or all of them may be achieved by hardware by being designed with an integrated circuit and so on for example. That is to say, all or some of the functions of the control unit can be achieved by an ASIC (Application Specific Integrated Circuit), an FPGA (Field Programmable Gate Array), and so on for example instead of a program.

LIST OF REFERENCE SIGNS

1: Wafer
2: Material to be etched
3: Mask
4: Non-etching layer
5: Depo film
6: Side wall
7: Line-and-space pattern
8: Polarization filter
9: Line direction
10: Polarization direction
11: Notch
20: Etching apparatus
21, 201, 202, 203: Processing chamber
22: Wafer stage
23: Gas supply unit 24: Depo process gas
25: Etching process gas
26: Detection unit
27: Radio frequency power source
28: Monitor unit
29: Monitor control unit
30: Bias power source
31: Radio frequency application unit
36: Apparatus control unit
37: Gas control unit
38: Exhaust system control unit
39: Radio frequency control unit
40: Bias control unit
41: Storage unit
42: Clock
44: Radio frequency power
45: Bias voltage
46: Control signal
47: Control line
102: Light source
103, 217, 218, 219: Rotation mechanism
104: Incident light
105: Coherent light
106: Optical fiber
107: Spectral apparatus
108, 220: Control unit
109: Calculation unit
110: Database
111: Fitting curve
120: Hole pattern
121: Side wall shape in the direction with a large pitch
122: Side wall shape in the direction with a small pitch
204: Wafer loader
205: Control PC
206: Rotation deck
207: Convey robot
208, 209, 210, 211: Notch position
212: Load lock chamber
213: Convey chamber
214, 215, 216: Rotation angle of polarization filter
221: Notch position adjustment stage

The invention claimed is:

1. A plasma processing method for etching a film to be etched by repeating a depositing process, the method comprising:
   a first step of depositing a layer over the film to be etched;
   a second step of removing a reaction product of the deposited layer and the film to be etched; and
   a monitoring process for monitoring a change amount of a film thickness of the deposited layer during said first step of depositing said layer using change of a coherent light that is obtained by irradiating a polarized light polarized to a predetermined angle with respect to a mask pattern of the film to be etched and is reflected by the mask pattern.

2. The plasma processing method according to claim 1, wherein the monitoring process is for monitoring a change amount of a film thickness of the deposited layer based on an amplitude and a cycle length of a fitting curve that is obtained using signal intensity of the coherent light.

3. The plasma processing method according to claim 1, wherein, when the mask pattern is a hole pattern and a pitch in one direction in the hole pattern is smaller than a pitch in another direction in the hole pattern, the polarized light is polarized orthogonally to a pitch in the one direction, and
the monitoring process is for monitoring a change amount of a film thickness related to a deposited layer of a side wall of the hole pattern on a side of the other direction.

4. The plasma processing method according to claim 1, wherein the monitoring process is for monitoring a change amount of a film thickness of the deposited layer based on a difference between signal intensity of the coherent light of the removing process and signal intensity of the coherent light of the first step depositing process.

5. The plasma processing method according to claim 4, wherein the difference is standardized by inclination of a fitting curve that is obtained using signal intensity of a coherent light of the second step.

6. The plasma processing method according to claim 5, wherein, when the mask pattern is a hole pattern and a pitch in one direction in the hole pattern is smaller than a pitch in another direction in the hole pattern, the polarized light is polarized orthogonally to a pitch in the one direction, and
the monitoring process is for monitoring a change amount of a film thickness related to a deposited layer of a side wall of the hole pattern on a side of the other direction.

7. The plasma processing method according to claim 1, wherein the predetermined angle is 90 degrees when the mask pattern is a line-and-space pattern.

8. The plasma processing method according to claim 7, wherein the monitoring process is for monitoring a change amount of a film thickness of the deposited layer based on a difference between signal intensity of the coherent light of the removing process and signal intensity of the coherent light of the first step depositing process.

9. The plasma processing method according to claim 7, wherein the monitoring process is for monitoring a change amount of a film thickness of the deposited layer based on an amplitude and a cycle length of a fitting curve that is obtained using signal intensity of the coherent light.

10. The plasma processing method according to claim 9, wherein, when the mask pattern is a hole pattern and a pitch in one direction in the hole pattern is smaller than a pitch in the other direction in the hole pattern, the polarized light is polarized orthogonally to a pitch in the one direction, and
the monitoring process is for monitoring a change amount of a film thickness related to a deposited layer of a side wall of the hole pattern on a side of the other direction.

11. A plasma processing apparatus, comprising:
a processing chamber where a sample is plasma-processed, a film to be etched being formed over the sample;
a radio frequency power source that supplies radio frequency power for generating plasma;
a sample deck on which the sample is mounted;
a light source that irradiates light;
a polarization filter that polarizes light irradiated from the light source to a predetermined angle with respect to a mask pattern of the film to be etched;
a rotation mechanism that controls the rotation angle of the polarization filter; and
a control unit configured to obtain a change amount of a film thickness of a layer deposited over the film to be etched, during a step of depositing said layer, using change of a coherent light that is obtained by irradiating the light polarized by the polarization filter whose rotation angle is controlled by the rotation mechanism and is reflected by the mask pattern.

12. The plasma processing apparatus according to claim 11,
wherein the rotation mechanism controls a rotation angle of the polarization filter so that the predetermined angle becomes 90 degrees when the mask pattern is a line-and-space pattern.

13. The plasma processing apparatus according to claim 11,
wherein the control unit is further configured to obtain said change amount of said film thickness of the deposited layer based on an amplitude and a cycle length of a fitting curve that is obtained using signal intensity of the coherent light.

14. The plasma processing apparatus according to claim 11,
wherein the control unit is further configured to obtain said change amount of said film thickness of the deposited layer based on a difference between a signal intensity of the coherent light of a step of removing a reaction product of the deposited layer and the film to be etched, and a signal intensity of the coherent light of said step of depositing said layer.

15. The plasma processing apparatus according to claim 14,
wherein the difference is a value standardized by inclination of a fitting curve that is obtained using signal intensity of a coherent light of the step removing the reaction product of the deposited layer and the film to be etched,
when the mask pattern is a hole pattern and a pitch in one direction in the hole pattern is smaller than a pitch in another direction in the hole pattern,
the rotation mechanism controls a rotation angle of the polarization filter so that the light is polarized orthogonally to a pitch in the one direction, and
the control unit is further configured to obtain a change amount of a film thickness related to said deposited layer of a side wall of the hole pattern on a side of the other direction.

* * * * *